United States Patent
Rostron et al.

(10) Patent No.: US 9,052,363 B2
(45) Date of Patent: Jun. 9, 2015

(54) HIGH VOLTAGE SWITCH BLADE CLOSING DETECTOR

(71) Applicants: Joseph R Rostron, McDonough, GA (US); Raj Anand, McDonough, GA (US); Brian VanHiel, Smyrna, GA (US); Kirk Charles, Austell, GA (US); Andres Rodriguez, Atlanta, GA (US); Brian Berner, Hampton, GA (US)

(72) Inventors: Joseph R Rostron, McDonough, GA (US); Raj Anand, McDonough, GA (US); Brian VanHiel, Smyrna, GA (US); Kirk Charles, Austell, GA (US); Andres Rodriguez, Atlanta, GA (US); Brian Berner, Hampton, GA (US)

(73) Assignee: South States LLC, Hampton, GA (US)

( * ) Notice: Subject to any disclaimer, the term of this patent is extended or adjusted under 35 U.S.C. 154(b) by 64 days.

(21) Appl. No.: 14/050,476

(22) Filed: Oct. 10, 2013

(65) Prior Publication Data

US 2015/0101915 A1 Apr. 16, 2015

(51) Int. Cl.
| | |
|---|---|
| *G08B 21/00* | (2006.01) |
| *G01R 31/327* | (2006.01) |
| *H01H 31/16* | (2006.01) |
| *H01H 31/02* | (2006.01) |
| *H01H 9/16* | (2006.01) |

(52) U.S. Cl.
CPC ........... *G01R 31/3275* (2013.01); *H01H 31/16* (2013.01); *H01H 31/026* (2013.01); *H01H 9/167* (2013.01); *H01H 2239/044* (2013.01); *H01H 2221/016* (2013.01); *H01H 2221/01* (2013.01)

(58) Field of Classification Search
USPC ............. 340/635, 638; 324/415, 424; 335/17; 83/62, 62.1, 58, 63, 781; 180/287, 289, 180/271; 307/31, 32; 361/115, 131
See application file for complete search history.

(56) References Cited

U.S. PATENT DOCUMENTS

| | | | | |
|---|---|---|---|---|
| 2,601,138 | A * | 6/1952 | Hart ................................. | 218/12 |
| 6,316,742 | B1 * | 11/2001 | Rostron et al. .................. | 218/84 |
| 7,055,417 | B1 * | 6/2006 | Gass ................................ | 83/58 |
| 7,476,823 | B2 * | 1/2009 | Rostron .......................... | 218/80 |
| 2007/0205665 | A1 * | 9/2007 | Kawano et al. ................. | 307/31 |
| 2013/0050882 | A1 * | 2/2013 | Rostron .......................... | 361/44 |
| 2014/0160612 | A1 * | 6/2014 | Rostron ......................... | 361/115 |

* cited by examiner

*Primary Examiner* — George Bugg
*Assistant Examiner* — Edny Labbees
(74) *Attorney, Agent, or Firm* — Mehrman Law Office; Michael J. Mehrman (57) ABSTRACT

A blade closing detector for an electric power switch includes a blade closing detector and an electronic or visual indicator. A first type of detector uses a gravity switch and a magnetic pickup to detect proper engagement between the blade and the switch. A second type of detector uses a sliding latch with a visual indicator rod to provide a visual indication of proper engagement of the blade within the jaws. A third type of detector uses a magnetic switch with a pivot arm and a dome shaped visual indicator. These detectors may be deployed individually or in combination and may be augmented with communication equipment to transmit switch status to a remote location. It will be understood that specific embodiments may include a variety of features in different combinations, as desired by different users.

21 Claims, 9 Drawing Sheets

HIGH VOLTAGE SWITCH BLADE CLOSING DETECTOR

TECHNICAL FIELD

The present invention relates to electric power switchgear and, more particularly, to a switch blade closing detector for a high voltage electric power disconnect switch.

BACKGROUND

Electric power blade-type disconnect switches utilize elongated blade arms to make physical and electrical connections at high voltages, such as sub-transmission and transmission voltages. The blade arms pivot into and out of connection with a receptacle typically referred to as the jaws. When the blade is in the closed position but not properly engaged within the jaws, the loose connection generates arcing that can damage the blade and jaws and inject unwanted noise onto the electrical system. A variety of techniques have therefore been developed to ensure that the blade arm makes a good physical and electrical connection with the jaws when the switch is closed. In particular, the blade arm typically rotates as it comes into contact with the jaws to form a tight interference fit with leaf springs within the jaws often referred to as the fingers. This causes the blade to first enter into the jaws, and then rotate so that it is squeezed between the leaf springs of the jaws, to create an interference fit ensuring a solid mechanical fit and a good (non-arcing) electrical connection between the blade and the jaws.

The blade and jaws are ordinarily exposed to the elements during normal operations. The conventional rotating blade connection works well provided that the there is no physical interference between the blade and jaws. During winter storms, however, ice can accumulate on the blade and jaws causing the blade to remain outside the jaws after the closing action. When the blade is in close proximity but not fully received and rotated into proper engagement within the jaws, the blade is close enough for arcing to develop between the blade and jaws. In addition, it may be difficult for a technician to visibly detect the poor connection when inspecting the switch from the ground, particularly during poor weather. Moreover, power line faults often occur during poor weather, making switch operation more likely. The resulting poor connection may not be detected until significant damage has been incurred by the switch. An arcing contact may also inject current spikes into the power line, which can be potentially damaging to sensitive devices, such as computers and other electronic devices.

Techniques used in prior detectors to indicate a properly engaged closed position requires a technician to look at the rotation of a "vertical pipe" that is part of the switch linkage, but visually inspecting the linkage is difficult from the ground, which is a long distance for viewing. The difficulty is complicated by the fact that there are a number of different types of mechanical malfunctions that can occur between the linkage and the critical elements of the blade and jaws. Significant operational difficulties can occur if there are false indications of proper engagement. Relying on the position of the "vertical pipe" in the linkage as the only indication of proper engagement of the blade within the jaws has resulted in too many failures of technicians to detect improper engagement of the blade within the jaws. Even experienced technicians can fail to determine the actual state of blade engagement and the error rate increases when with lower level of experience of the technicians.

As a result, there is significant need for a more reliable and prominently visible blade closing detector to prevent false indications of proper blade engagement and the resulting damage that can occur from improper blade engagement.

SUMMARY

The present invention may be embodied in a blade closing detector for an electric power switch with an electric indicator, a visual indicator, or a combination of electric and visual indicators. A first type of detector uses a gravity switch and a magnetic pickup to detect proper engagement between the blade and the switch. A second type of detector uses a sliding latch with a visual indicator rod to provide a visual indication of proper engagement of the blade within the jaws. A third type of detector uses a magnetic switch with a pivot arm and a dome shaped visual indicator. These detectors may be deployed individually or in combination and may be augmented with communication equipment to transmit the switch status to a remote location. Each embodiment has an indication sensitivity sufficient to distinguish between proper engagement of the blade within the jaws and the situation where the blade is in close proximity to the jaws but not in proper engagement, for example where accumulated ice has prevented the blade from moving into proper engagement.

Generally described, the blade closing detector is configured for or installed on a high voltage electric power switch that includes a pivoting blade arm and jaws for receiving the blade arm to form a high voltage electrical connection in which a proper electrical connection is created by proper physical engagement of the blade arm within the jaws. The blade closing detector includes a first detector component having a first indicator actuation element carried by the blade arm, and a second detector component having a second indicator actuation element located near the jaws. The first and second detector components are positioned to cause the first indicator actuation element to become positioned adjacent to the second indicator actuation element when the blade arm is properly engaged within the jaws. In addition, the first and second indicator actuation elements have an indication sensitivity causing an indicator actuation to be caused by the first and second indicator actuation elements when the blade arm comes into proper physical engagement within the jaws. Similarly, the indication sensitivity causes no indicator actuation to be caused by the first and second indicator actuation elements when the blade arm comes into close proximity of the jaws without entering into proper physical engagement within the jaws.

The blade closing detector may also include an indicator providing a visual distinction between a detector indicator actuation and no detector indicator actuation. For example, the visual indicator may include an indicator rod that changes in position to provide the visual distinction, such as a "dip stick" moved by a latch operated during proper blade engagement. As another alternative, the visual indicator may change in color to provide the visual distinction. The blade closing detector may also include an electric indicator producing an electric signal providing a distinction between an indicator actuation and no indicator actuation caused by the first and second indicator actuation elements and a transmitter for communicating the electric signal to a location remote from the blade closing detector. As examples, the remote location may be a control panel at the premises where the blade closing detector is located or a control center located away from the premises where the blade closing detector is located.

There are several alternatives described for the blade closing detector to illustrate various approaches for the realizing embodiments of the invention. In a first configuration, the first indicator actuation element includes a gravity activated magnetic element that moves from an open position when the blade arm is in an open position to a closed position when the blade arm is in proper engagement within the jaws. The second indicator actuation element includes a magnet that detects the presence of the gravity activated conductive element when the blade arm is in proper engagement within the jaws. As a specific option, the gravity activated magnetic element may be a ferro-magnetic, AlNiCo magnetic or other magnetically sensitive ball that moves within a tube as the blade is rotated into a horizontal orientation. But the magnetic pickup has an indication sensitivity that only detects the presence of the magnetically sensitive ball when the blade arm is fully received within the jaws and rotated to horizontal.

In another configuration, the first indicator actuation element includes a hook and the second indicator actuation element includes a latch configured to be moved by the hook as the blade arm moves into proper engagement within the jaws. For this option, the visual indicator may be an indicator rod that moves with the latch to provide a visual indication of the state of the switch. The hook and latch are sized and positioned to exhibit an effective indication sensitivity requiring the blade arm to be fully received within the jaws and rotated to horizontal in order for the hook to physically engage and move the latch.

In an third illustrative configuration, the first indicator actuation element includes a first magnet and the second indicator actuation element includes a second magnet located on a pivot arm that that moves the second magnet from an open position when the blade arm is in an open position to a closed position when the blade arm is in proper engagement within the jaws. For this option, the pivot arm may be connected to a linkage that operates an indicator providing a visual distinction between an indicator actuation and no indicator actuation caused by the first and second indicator actuation elements. But the first and second magnets has an indication sensitivity that only move the pivot arm when the blade arm is fully received within the jaws and rotated to horizontal.

It will be understood that specific embodiments may include a variety of features in different combinations, as desired by different users. In view of the foregoing, it will be appreciated that the present invention provides a cost effective blade closing detector for a high voltage switch. The specific techniques and structures for implementing particular embodiments of the invention and accomplishing the associated advantages will become apparent from the following detailed description of the embodiments and the appended drawings and claims.

BRIEF DESCRIPTION OF THE FIGURES

The numerous advantages of the invention may be better understood with reference to the accompanying figures in which.

DETAILED DESCRIPTION

In particular embodiments, a blade-type disconnect switch may include a gravity switch blade closing detector, a sliding latch blade closing detector, or a magnetic switch with a pivoting arm that operates an indicator. The detector may include a visual indicator, and electric indicator, or a combination. The blade closing detector is not dependent on the service voltage and, therefore, may be operated at any voltage at which a blade-type disconnect switch is operation. It will be appreciated that in a blade-type high voltage switch, the blade arm both moves down into the jaws and rotates to enter into proper engagement between leaf spring fingers within the jaws. A false indication of a proper closing can result if the detector is not capable of distinguishing between proper engagement and the situation where the blade arm is positioned near the jaws but has not properly engaged within the jaws, which can result from ice accumulation, a bent blade arm, a bent or loose blade arm actuator, an obstructed blade arm or actuator, or another type of blade closing failure. The blade closing detector therefore has an indication sensitivity that distinguishes between proper engagement and the situation where the blade arm comes into close proximity of the jaws without entering into proper physical engagement within the jaws. As a result, the indicator only changes state when the blade arm has moved into its closed position and has also rotated into proper engagement within the jaws, and not merely in response to the blade arm coming into close proximity of the jaws without entering into proper physical engagement within the jaws.

The blade closing detectors are typically utilized in high voltage substations, such as those operating a sub-transmission and transmission voltages. The blade-type disconnect switches operate in open air, which exposes them to weather elements which can include icing, high winds and flying debris. Although the switches utilize arcing in open air, they include arcing horns to conduct the arcing current before the blade are comes into close proximity to the jaws to protect the blade and jaws from damage caused by arcing. Arcing can damage the blade and horn, however, if the blade arm moves past the arcing horn, comes near the jaws, and rotates to the horizontal orientation but without fully entering into the jaws and engaging into the desired interference fit between the leaf spring fingers of the jaws. This can happen, for example, when ice buildup or a bent or loose component prevents the blade from fully entering the jaws at the bottom of the closing stroke before the blade arm rotates to the horizontal orientation. Alternatively, the blade arm may fully enter into the jaws but fail to properly rotate to the desired horizontal orientation to engage with the leaf springs within the jaws. This can happen, for example, when the blade arm actuation mechanism is loose, broken, bent or obstructed. In both instances, the blade arm ends up in close proximity to the jaws without properly engaging within the jaws. The blade closing detectors provide an indication when either of these blade closing failures occur allowing technicians to take corrective action, such as clearing the switch of ice or replacing bent, loose or obstructed components.

The blade-type disconnect switch may be motorized or operated manually. Accordingly, an electric blade closing indication or a visible indication may be appropriate depending on the type of switch. It may also be advantageous to deploy both types of indicators to provide backup confirmation of proper blade closing. A backup gravity switch may also provide an alternate indication in the event that ice interferes with operation of the sliding latch indicator. It will be appreciated that the specific indicator designs are merely illustrative, and that a variety of alternatives and modifications may be employed in accordance with the principles of the invention. For example, while two specific types of visual indicators (an indicator rod and a dome-shaped color indicator), any suitable type of visual indicator may be employed, such as a pop-up flag, a display surface that flips or rotates, an arm that pivots from horizontal to vertical, and so forth.

Figure 1A:
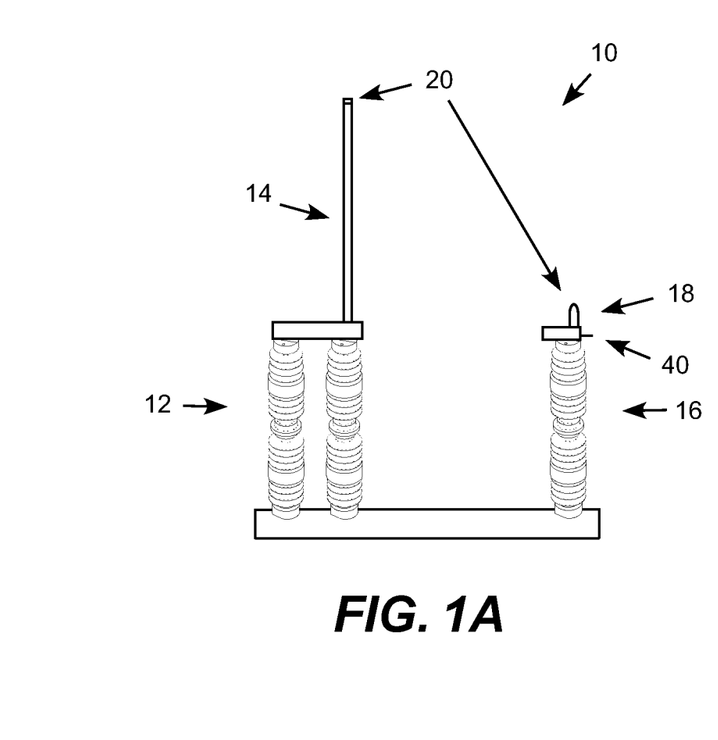
FIG. 1A is a conceptual illustration of a blade-type disconnect switch with blade closing detectors in an open position.
Figure 1B:
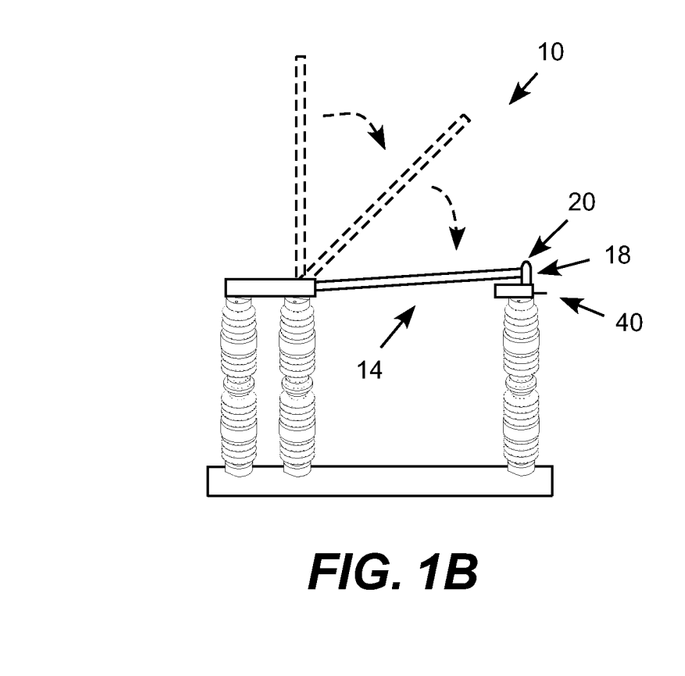
FIG. 1B is a conceptual illustration of the blade-type disconnect switch with the blade closing detectors in a closed position.
Figure 4A:
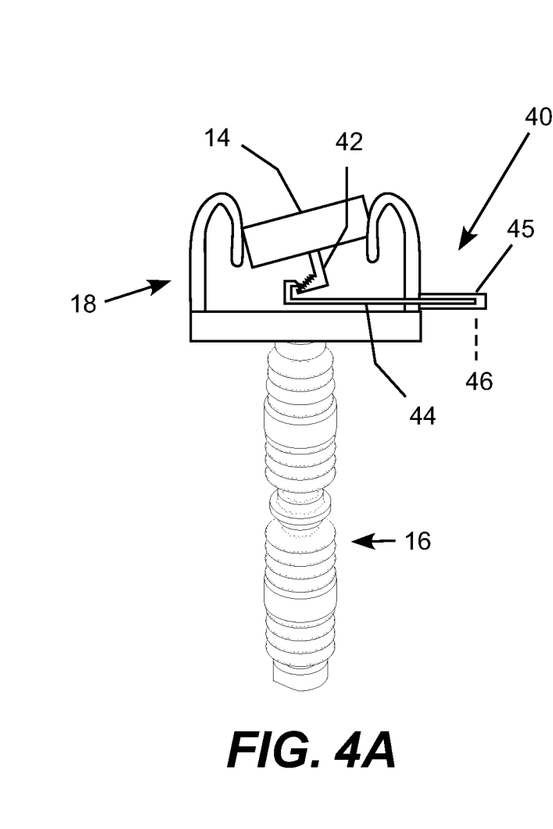
FIG. 4A is a conceptual illustration of a blade-type disconnect switch with a sliding latch closing detector in an open position.
Figure 4B:
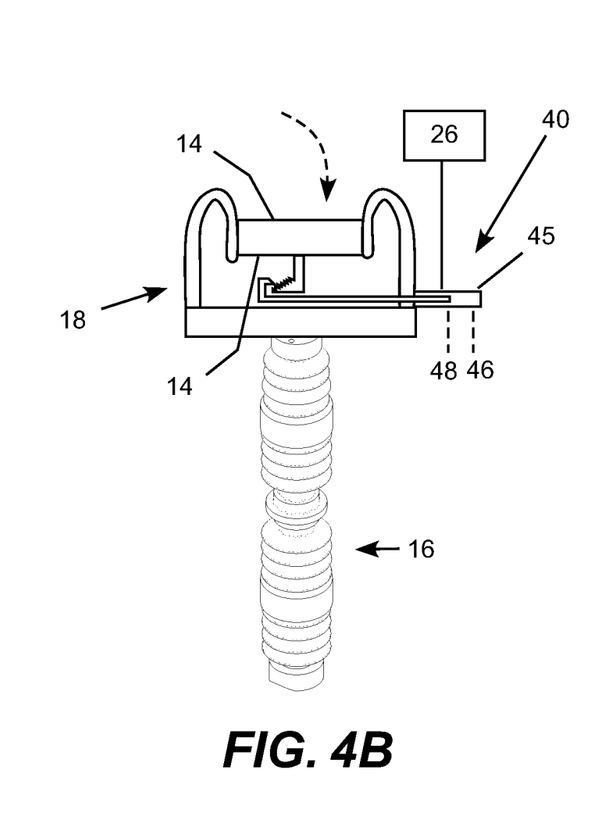
FIG. 4B is a conceptual illustration of the blade-type disconnect switch with the sliding latch blade closing detector in a closed position.
Figure 5:
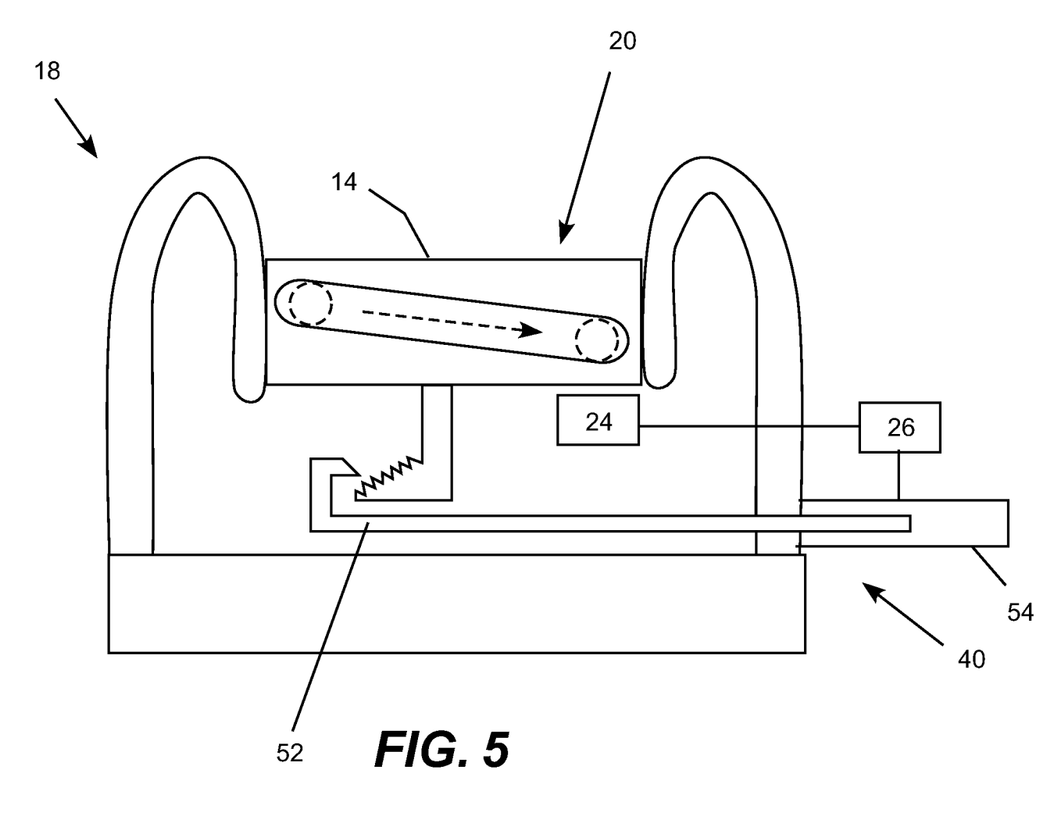
FIG. 5 is a conceptual illustration of the blade-type disconnect switch with a gravity switch blade closing detector and a sliding latch blade closing detector.

FIG. 1A is a conceptual illustration of a blade-type disconnect switch 10 with a blade closing detectors 20 and 40 in an open position. The disconnect switch includes a blade side having a pair of insulators 12 that support a pivoting blade arm 14. A receiving side of the switch includes an insulator 16 supporting a jaws 18 that receives the blade 14 when the blade is pivoted into the closed position, as shown in FIG. 1B. This embodiment includes two blade closing detectors, a gravity switch detector 20 and a sliding latch detector 40. The gravity switch detector 20 is described in greater detail with reference to FIGS. 2A-2C and 3, whereas the sliding latch detector 40 in greater detail with reference to FIGS. 4A-4B. An embodiment including both types of detectors is shown in FIG. 5.

Figure 2A:
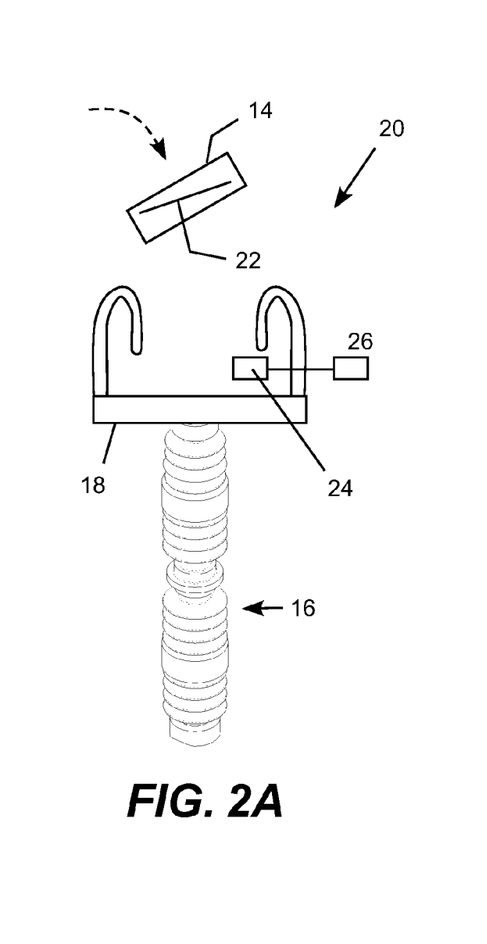
FIG. 2A is a conceptual illustration of the blade-type disconnect switch with a gravity switch blade closing detector as the blade arm approaches the jaws.
Figure 2B:
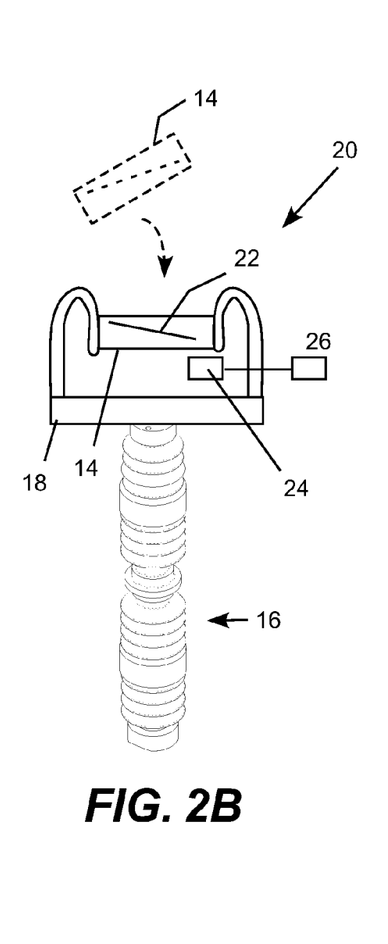
FIG. 2B is a conceptual illustration of the blade-type disconnect switch with the gravity switch blade closing detector after the blade arm has entered into correct engagement with the jaws.

Referring to FIGS. 2A and 2B, the jaws 18 includes a pair of fingers that act as leaf springs to engage in a tight interference fit with the blade 14. During the closing stroke, the blade 14 pivots downward into the space between the fingers with the blade arm held at a longitudinal angle. The blade arm then rotates along its longitudinal axis to a horizontal orientation causing the blade arm to enter into a tight interference fit between the leaf spring fingers within the jaws 18. To provide the blade closing detector, the tip of the blade 14 includes a gravity switch 22 serving as a first indicator actuation element that is tipped (typically to about 7° declining) into a gravity activated position as the blade is rotated into a horizontal orientation for engagement within the jaws. Referring to the orientations shown in FIGS. 2A and 2B to illustrate the operating principle, the gravity switch is deactivated (moved to the left by the force of gravity) when the blade arm is fully rotated counterclockwise, and activated (moved to the right by the force of gravity) when the blade arm is fully rotated clockwise to a horizontal orientation. A magnetic pickup 24 serving as a second indicator actuation element is positioned within or adjacent to the jaws to detect close proximity of the first indicator actuation element when the gravity switch has been tipped past horizontal into a gravity activated position. The magnetic pickup 24 may be connected to a communication device 26 operable for transmitting an indication of the status of the detector 20 to a remote location, which typically includes an electronic indicator located at the site of the disconnect switch such as an eye-level control panel in the substation where the switch is located, and/or a central control station via SCADA or another suitable communication system.

Figure 2C:
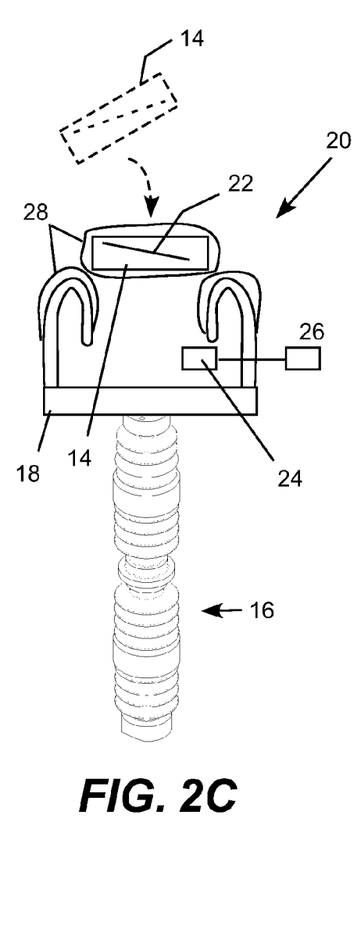
FIG. 2C is a conceptual illustration of the blade-type disconnect switch with the gravity switch blade closing detector where the blade arm is in the closed position but ice buildup has prevented the blade from entering into proper engagement with the jaws.

The magnetic pickup 24 has an indication sensitivity requiring sufficiently close proximity between the pickup and the gravity switch 22 in the gravity activated position to avoid a false blade closing detection upon failure of the blade to fully enter the jaws and rotate into proper engagement. That is, the magnetic pickup 24 will not indicate a proper blade closing when the blade is in close proximity to the jaws but has not fully entered into the jaws and rotated into the correct horizontal orientation within the jaws. FIG. 2C is a simplified depiction of an incomplete blade closing stroke, where ice buildup 28 has prevented the blade 14 from fully entering the jaws 18. In this position, the blade 14 is in close proximity to the jaws but has not entered into proper engagements within the jaws. As a result, the blade 14 has moved past the arcing horn (which extends above the jaws) yet is close enough to the jaws 18 to cause arcing between the blade and the jaws. With the blade rotated to horizontal, the interference fit between the blade and the jaws typically prevents the blade from dropping into the jaws even when the ice melts. With the blade is in this position, it is typically difficult to visually detect the improper blade-jaws connection from the ground and any indicator triggered by rotation of the blade to horizontal will falsely indicate a proper blade closing. Breakers and other protection equipment will also fail to detect this situation because the poor blade connection does not produce high fault or neutral currents. As a result, the poor blade connection may go undetected for days or longer, potentially resulting in arcing damage to the blade and jaws as well as the injection of arcing noise into the power line.

Figure 3:
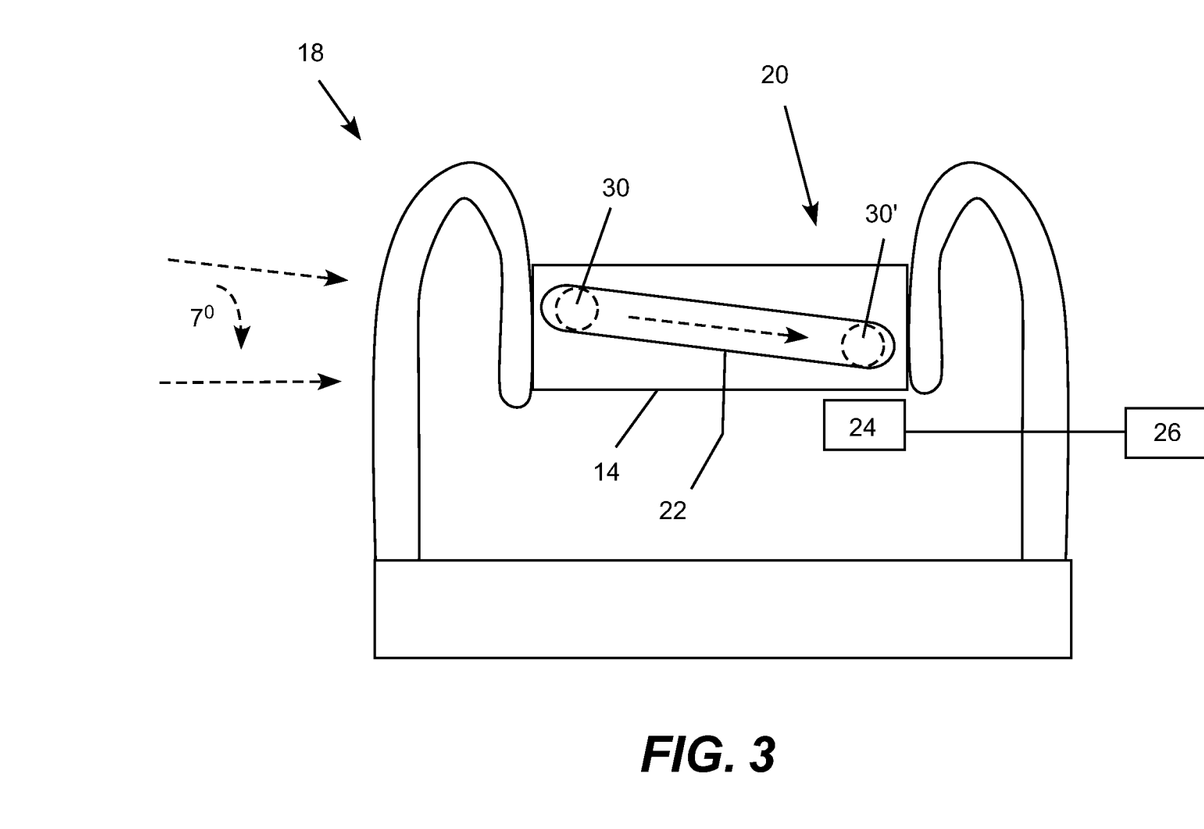
FIG. 3 is a conceptual illustration of the blade in proper engagement with the jaws showing details of the gravity switch blade closing detector.

FIG. 3 shows an example type of gravity switch detector 20, which includes a tube 22 located on the tip of the blade 14 with a magnetically sensitive ball 30 serving as the first indicator actuation element located in the tube and sized to roll within the tube under the force of gravity. For example, the magnetically sensitive ball 30 may include ferro-magnetic, AlNiCo-magnetic, or another suitable type of magnetically sensitive component. The tube 22 is declined with respect to the horizontal orientation of the blade, for example by 7° as shown in FIG. 3. This causes the magnetically sensitive ball to roll from the gravity deactivated position indicated by the magnetically sensitive ball 30 to the gravity activated position indicated by the ball 30' when the blade is rotated into engagement with the jaws. The ball 30 is likewise rolled from the gravity activated position indicated by the ball 30' to the gravity deactivated position indicated by the ball 30 when the blade is rotated out of engagement with the jaws.

Since many disconnect switches are manually operated or inspected, a visible indicator may also be utilized. FIG. 4A is a conceptual illustration of a blade-type disconnect switch 40 with a sliding latch 44 closing detector in an open position. In this embodiment, the underside of the blade carries a hook 42 (serving as the first indicator actuation element) that engages the sliding latch 44 (serving as the second indicator actuation element) as the blade is rotated into engagement within the jaws. The sliding latch 44 extends or is connected to an indicator rod (dip stick) located within an indicator tube 45, which may be transparent or have a transparent window or other indicator located outside the jaws where it can be easily seen from ground level. The sliding latch 44 is spring loaded toward the open switch indication position 46 shown in FIG. 4A. As the blade rotates into engagement within the jaws, the hook 42 moves the sliding latch 44 into the closed switch indication position 48 shown in FIG. 4B. The indicator may also be connected to a communication device 26, which transmits the blade closing status information generated by the sliding latch to a remote location.

FIG. 5 is a conceptual illustration of the blade-type disconnect switch including a combination of the gravity switch detector 20 and the sliding latch detector 40 utilizing a common communication device 26.

Figure 7A:
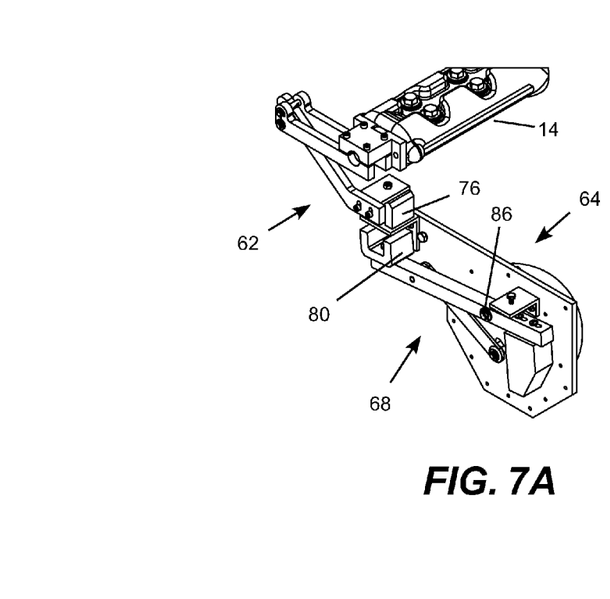
FIG. 7A is a perspective view of the magnetic blade closing detector in a partially closed position.
Figure 7B:
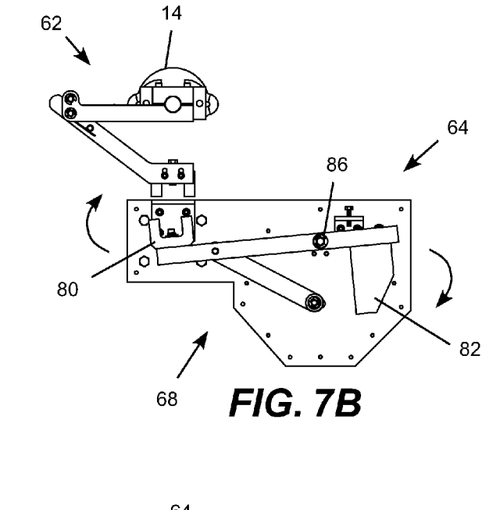
FIG. 7B is a front view of the magnetic blade closing detector in the partially closed position.
Figure 7C:
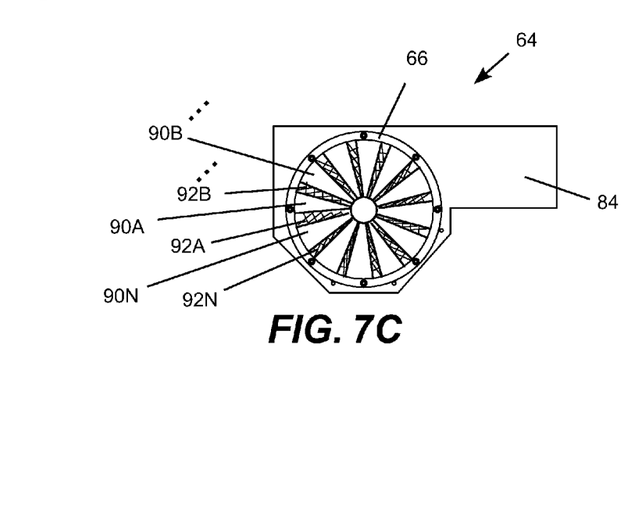
FIG. 7C is a rear view of the magnetic blade closing detector in the partially closed position.
Figure 8A:
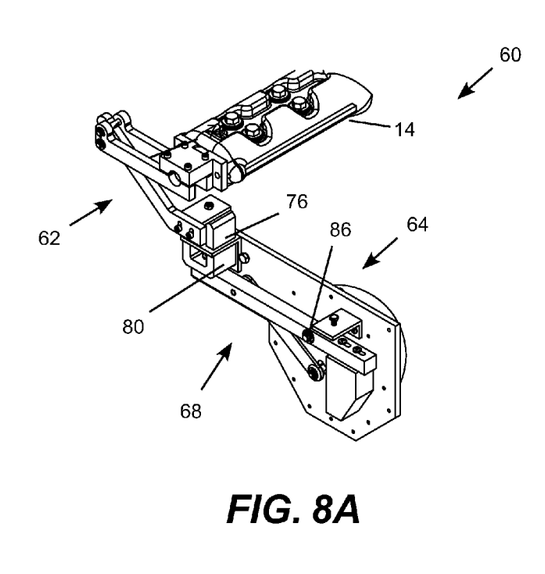
FIG. 8A is a perspective view of the magnetic blade closing detector in a closed position.
Figure 8B:
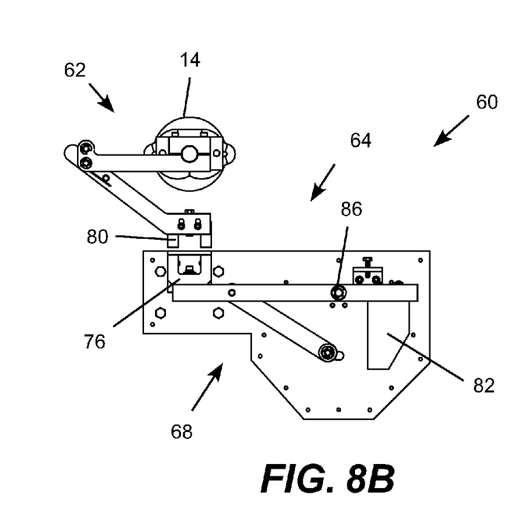
FIG. 8B is a front view of the magnetic blade closing detector in the closed position.
Figure 8C:
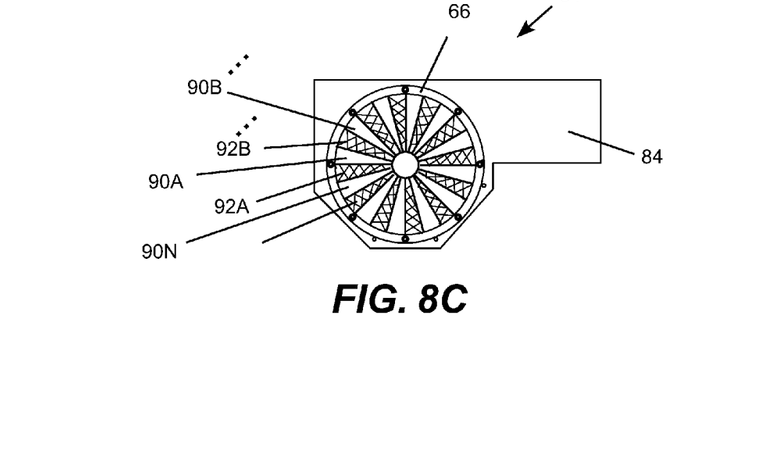
FIG. 8C is a rear view of the magnetic blade closing detector in the closed position.

FIGS. 6A-6D show perspective, front, rear and end views of a third type of detector referred to as a magnetic blade closing detector 60. As with any type of blade closing detector, this embodiment may be deployed with or without the communication device 26 described previously, as desired. This set of figured shows the magnetic blade closing detector in its open position from different orientations. FIGS. 7A-7C show the detector in a partially closed position, and FIGS. 8A-8C show the detector in the fully closed position. This detector 60 includes a tip bracket 62 that is carried on the end of the blade arm 14 and a detector box 64 with a visual indicator 66 mounted to the switch stand. The tip bracket 62 includes a mounting brace 70 connected to the end of the blade arm and magnet support arm 74 that supports a first magnet 76 (serving as the first indicator actuation element) below the mounting brace 70 where it will be brought into close proximity to the detector box 64 when the blade arm 14 moves into proper engagement within the jaws. The angle between the mounting brace 70 and the magnet support arm 74 is adjustable for calibrating the distance between the magnet 76 and the detector box 64 once they have been installed.

Figure 6A:
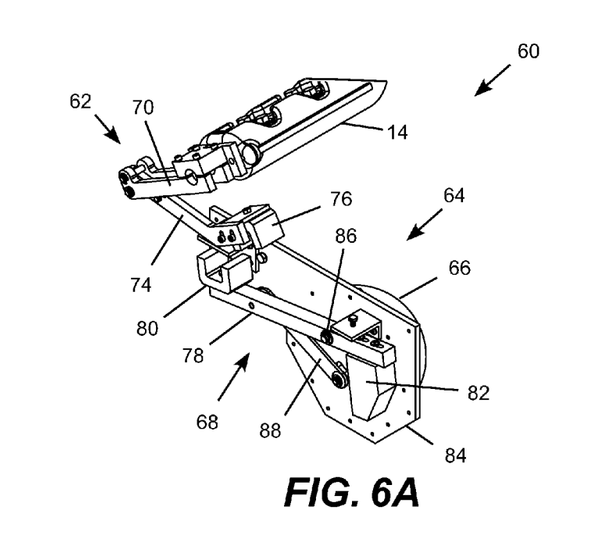
FIG. 6A is a perspective view of a magnetic blade closing detector in an open position.
Figure 6B:
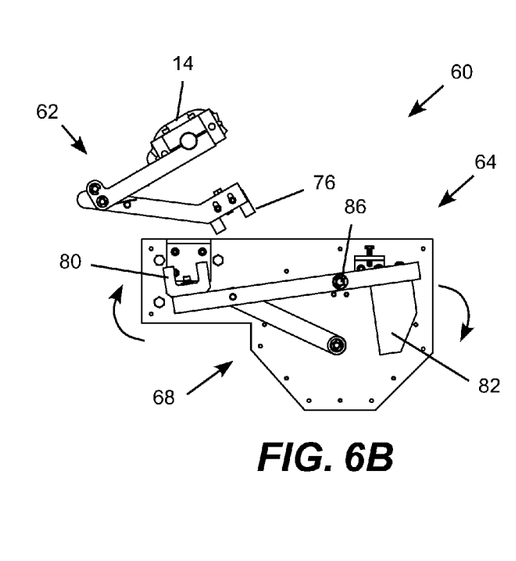
FIG. 6B is a front view of the magnetic blade closing detector in the open position.
Figure 6C:
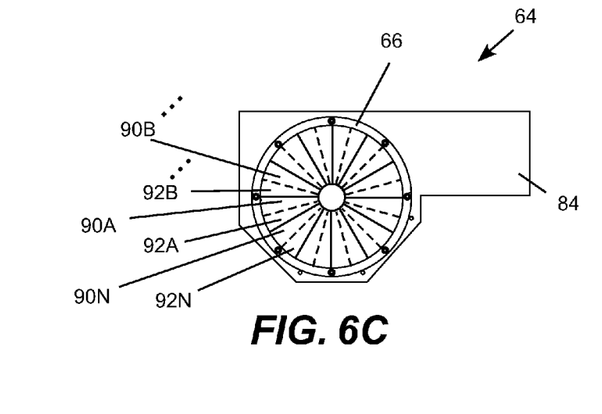
FIG. 6C is a rear view of the magnetic blade closing detector in an the open position.
Figure 6D:
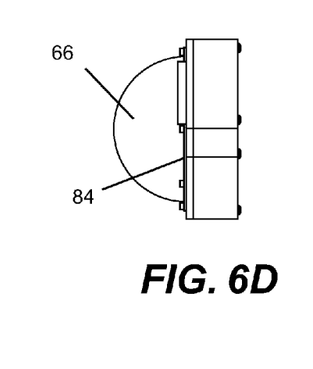
FIG. 6D is an end view of the magnetic blade closing detector in the open position.

FIGS. 6A and 6B show the detector box 64 with its plastic cover removed to reveal the internal detector mechanism 68, which includes a lever arm 78 that pivots about a pivot point 86. A first end of the lever arm 78 carries a second magnet 80 (serving as the second indicator actuation element) and the opposing end carries a counterweight 82. The detector box 64 is positioned with the magnet 80 adjacent to the magnet 76 when the blade arm 14 is in its closed position. The magnet 80 is slightly heavier than the counterweight 82 to bias the lever arm to pivot counterclockwise under the force of gravity, which allows the magnet 80 to fall downward into its open position when the blade arm is in its open position, as shown in FIGS. 6A-6D. The attractive force between the magnets 79 and 80 is sufficient to overcome the gravitational bias to rotate the lever arm 78 clockwise and pull the magnet 80 upward into its closed position, which is shown in FIGS. 8A-C.

As the lever arm 78 pivots between the open and closed positions, it rotates a connector arm 88 that operates a linkage that, in turn, operates the dome shaped visual indicator 66 mounted on the base plate 84 of the detector box 64. In this particular embodiment, the visual indicator includes an outer dome divided into a number of colored sections 90A-90N (typically black) and a number of transparent sections 92A-92N. An inner dome carries corresponding first colored sections 91A-91N having the same color as the colored sections 90A-90N or the outer dome (typically black), and alternating second colored sections 93A-93N that have a different color (typically red). When the detector is in the open position, as shown in FIGS. 6A-6D the first colored sections 91A-91N of the inner dome are positioned under the transparent sections 92A-92N of the outer dome so that the indicator 66 appears to have a solid color (typically black). When the detector is in the closed position, as shown in FIGS. 8A-8C the second colored sections 93A-93N of the inner dome are positioned under the transparent sections 92A-92N of the outer dome so that the indicator 66 appears to have sections with alternating colors (typically red and black).

Figure 9:
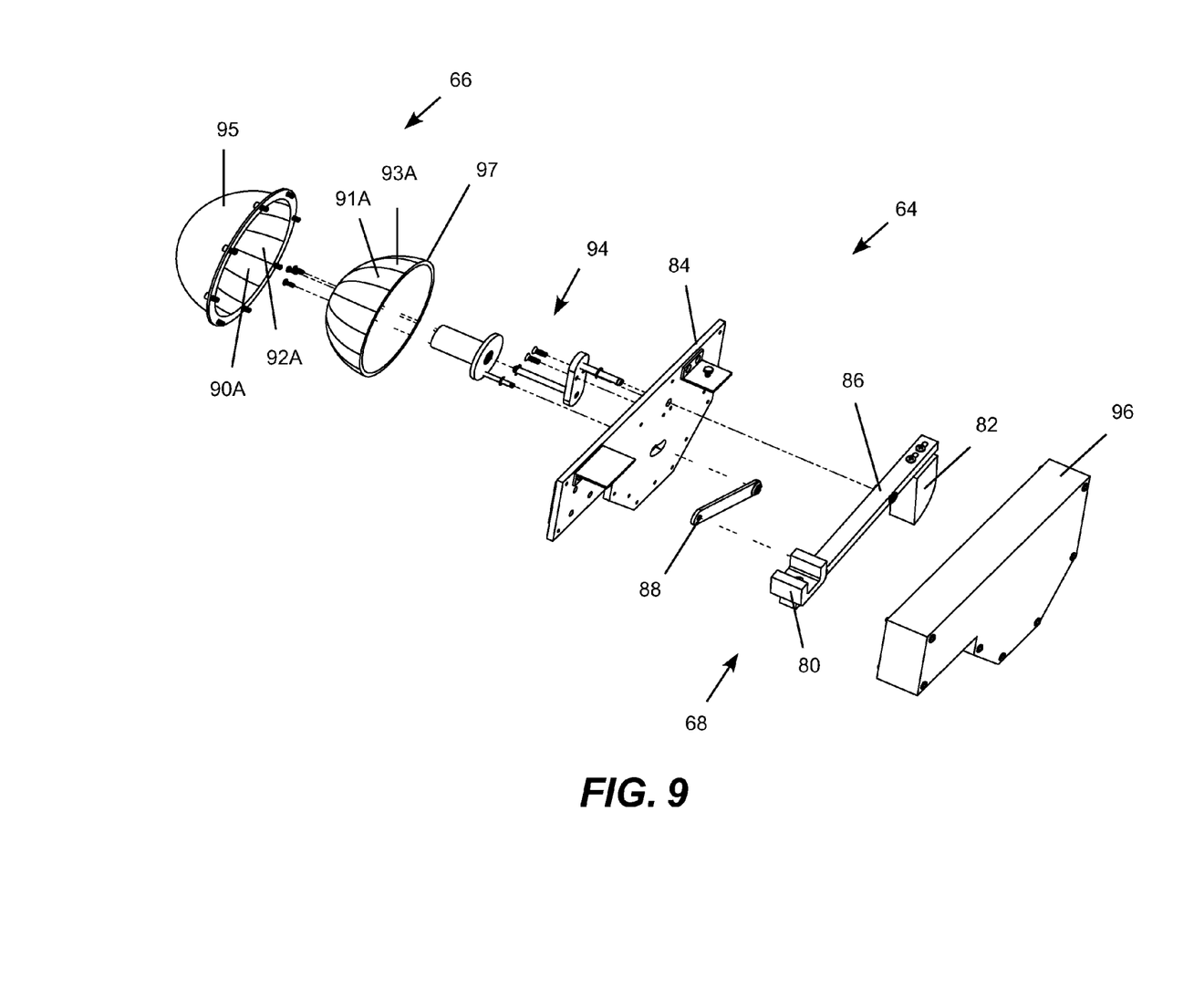
FIG. 9 is an assembly view of a detector box of the magnetic blade closing detector.

FIG. 9 is an assembly view of the detector box 64 the internal components of the detector box including the linkage 94 that operates the visual indicator. The indicator includes an outer dome 95 (having alternating colored sections 90A-90N and transparent sections 92A-92N) and an inner dome 97 (having alternating first colored sections 91A-91N and second colored sections 93A-93N). The connector arm 88 operates a linkage 94 under the domes that rotate the inner dome 97 so that the first sections of the inner dome are positioned under the transparent sections of the outer dome to give the indicator a first appearance to indicate a first switch state (e.g., solid color indicating an open switch, as shown in FIGS. 6A-6D). Similarly, when the blade arm is properly engaged in the jaws, the connector arm 88 operates a linkage 94 to rotate the inner dome 97 so that the second sections of the inner dome are positioned under the transparent sections of the outer dome to give the indicator a second appearance to indicate a first switch state (e.g., alternating colors indicating a closed switch, as shown in FIGS. 8A-8C).

In view of the foregoing, it will be appreciated that present invention provides significant improvements in blade closing detectors for high voltage switches. The foregoing relates only to the exemplary embodiments of the present invention, and that numerous changes may be made therein without departing from the spirit and scope of the invention as defined by the following claims.

The invention claimed is:

1. A blade closing detector for a high voltage electric power switch that includes a pivoting blade arm and jaws for receiving the blade arm to form a high voltage electrical connection in which a proper electrical connection is created by proper physical engagement of the blade arm within the jaws, the blade closing detector comprising:

a first detector component having a first indicator actuation element carried by the blade arm;

a second detector component having a second indicator actuation element located near the jaws;

the first and second detector components positioned to cause the first indicator actuation element to become positioned adjacent to the second indicator actuation element when the blade arm is properly engaged within the jaws;

wherein the first and second indicator actuation elements have an indication sensitivity causing an indicator actuation to be caused by the first and second indicator actuation elements when the blade arm comes into proper physical engagement within the jaws; and wherein the indication sensitivity causing no indicator actuation to be caused by the first and second indicator actuation elements when the blade arm comes into close proximity of the jaws without entering into proper physical engagement within the jaws.

2. The blade closing detector of claim 1, further comprising an indicator providing a visual distinction between an indicator actuation and no indicator actuation caused by the first and second indicator actuation elements.

3. The blade closing detector of claim 2, wherein the visual indicator includes an indicator rod that changes in position to provide the visual distinction.

4. The blade closing detector of claim 2, wherein the visual indicator includes a change in color to provide the visual distinction.

5. The blade closing detector of claim 1, further comprising an electronic indicator producing an electric signal providing a distinction between an indicator actuation and no indicator actuation caused by the first and second indicator actuation elements.

6. The blade closing detector of claim 1, further comprising a transmitter for communicating the electric signal to a location remote from the blade closing detector.

7. The blade closing detector of claim 6, wherein the location remote comprises a control panel at the premises where the blade closing detector is located.

8. The blade closing detector of claim 6, wherein the location remote comprises a control center away from the premises where the blade closing detector is located.

9. The blade closing detector of claim 1, wherein:
the first indicator actuation element comprises a gravity activated magnetic element that moves from an open position when the blade arm is in an open position to a closed position when the blade arm is in proper engagement within the jaws; and
the second indicator actuation element comprises a magnet that detects presence of the gravity activated magnetic element when the blade arm is in proper engagement within the jaws.

10. The blade closing detector of claim 9, wherein the gravity activated magnetic element comprises a magnetically sensitive that moves within a tube.

11. The blade closing detector of claim 1, wherein:
the first indicator actuation element comprises a hook; and
the second indicator actuation element comprises a latch configured to be moved by the hook as the blade arm moves into proper engagement within the jaws.

12. The blade closing detector of claim 1, wherein:
the first indicator actuation element comprises a first magnet; and
the second indicator actuation element comprises a second magnet positioned on a pivot arm that that moves the second magnet from an open position when the blade arm is in an open position to a closed position when the blade arm is in proper engagement within the jaws.

13. The blade closing detector of claim 12, wherein the pivot arm is connected to a linkage that operates an indicator providing a visual distinction between an indicator actuation and no indicator actuation caused by the first and second indicator actuation elements.

14. The blade closing detector of claim 12, wherein the pivot arm is connected to an electronic indicator producing an electric signal providing a distinction between an indicator actuation and no indicator actuation caused by the first and second indicator actuation elements.

15. A high voltage electric power switch, comprising:
a pivoting blade arm;
jaws for receiving the blade arm to form a high voltage electrical connection in which a proper electrical connection is created by proper physical engagement of the blade arm within the jaws; and
a blade closing detector comprising:
a first detector component having a first indicator actuation element carried by the blade arm,
a second detector component having a second indicator actuation element located near the jaws,
the first and second detector components positioned to cause the first indicator actuation element to become positioned adjacent to the second indicator actuation element when the blade arm is properly engaged within the jaws,
wherein the first and second indicator actuation elements have an indication sensitivity causing an indicator actuation to be caused by the first and second indicator actuation elements when the blade arm comes into proper physical engagement within the jaws,
wherein the indication sensitivity causing no indicator actuation to be caused by the first and second indicator actuation elements when the blade arm comes into close proximity of the jaws without entering into proper physical engagement within the jaws, and
further comprising an indicator providing a visual distinction between an indicator actuation and no indicator actuation caused by the first and second indicator actuation elements.

16. The high voltage electric power switch of claim 15, wherein:
the first indicator actuation element comprises a gravity activated magnetic element that moves from an open position when the blade arm is in an open position to a closed position when the blade arm is in proper engagement within the jaws; and
the second indicator actuation element comprises a magnet that detects presence of the gravity activated magnetic element when the blade arm is in proper engagement within the jaws.

17. The high voltage electric power switch of claim 15, wherein:
the first indicator actuation element comprises a hook; and
the second indicator actuation element comprises a latch configured to be moved by the hook as the blade arm moves into proper engagement within the jaws.

18. The high voltage electric power switch of claim 15, wherein:
the first indicator actuation element comprises a first magnet; and
the second indicator actuation element comprises a second magnet positioned on a pivot arm that that moves the second magnet from an open position when the blade arm is in an open position to a closed position when the blade arm is in proper engagement within the jaws.

19. A method for indicating proper physical engagement of a blade arm within a jaws blade of a high voltage electric power switch in which a proper electrical connection is created by the proper physical engagement of the blade arm within the jaws, comprising the steps of:
providing a first detector component having a first indicator actuation element on the blade arm;
providing a second detector component having a second indicator actuation element near the jaws;
positioning the first and second detector components positioned to cause the first indicator actuation element to become positioned adjacent to the second indicator actuation element when the blade arm is properly engaged within the jaws;

wherein the first and second indicator actuation elements have an indication sensitivity causing an indicator actuation to be caused by the first and second indicator actuation elements when the blade arm comes into proper physical engagement within the jaws;

wherein the indication sensitivity causing no indicator actuation to be caused by the first and second indicator actuation elements when the blade arm comes into close proximity of the jaws without entering into proper physical engagement within the jaws, and providing an indicator providing a visual distinction between an indicator actuation and no indicator actuation caused by the first and second indicator actuation elements.

20. The method of claim 19, further comprising providing an electronic indicator producing an electric signal providing a distinction between an indicator actuation and no indicator actuation caused by the first and second indicator actuation elements.

21. The blade closing detector of claim 12, wherein: the pivot arm is connected to a linkage that operates an indicator providing a visual distinction between an indicator actuation and no indicator actuation caused by the first and second indicator actuation elements; and the pivot arm is connected to an electronic indicator producing an electric signal providing a distinction between an indicator actuation and no indicator actuation caused by the first and second indicator actuation elements.

* * * * *